United States Patent [19]

Quan et al.

[11] Patent Number: 5,776,798
[45] Date of Patent: Jul. 7, 1998

[54] SEMICONDUCTOR PACKAGE AND METHOD THEREOF

[75] Inventors: Son Ky Quan, Fountain Hills; Samuel L. Coffman, Scottsdale; Bruce Reid, Mesa; Keith E. Nelson, Tempe, all of Ariz.; Deborah A. Hagen, Austin, Tex.

[73] Assignee: Motorola, Inc., Schaumburg, Ill.

[21] Appl. No.: 708,296

[22] Filed: Sep. 4, 1996

[51] Int. Cl.$^6$ ............................................. H01L 21/44
[52] U.S. Cl. ............................................. 438/112; 438/460
[58] Field of Search .............................. 438/112, 113, 438/460, 464, 465

[56] References Cited

U.S. PATENT DOCUMENTS

| | | | |
|---|---|---|---|
| 4,961,821 | 10/1990 | Drake et al. | 438/113 |
| 5,061,657 | 10/1991 | Queen et al. | 438/126 |
| 5,188,984 | 2/1993 | Nishiguchi | 438/125 |
| 5,462,636 | 10/1995 | Chen et al. | 438/465 |
| 5,491,111 | 2/1996 | Tai | 438/113 |
| 5,604,160 | 2/1997 | Warfield | 438/113 |
| 5,641,714 | 6/1997 | Yamanaka | 438/464 |

OTHER PUBLICATIONS

Arnold et al., "Stressed-out-Microelectronic Encapsulation Finds Cure in Aerobic Adhesives", Advanced Packaging, Jan./Feb. 1996, pp. 30,32,34.

*Primary Examiner*—Kevin Picardat
*Attorney, Agent, or Firm*—Robert F. Hightower

[57] ABSTRACT

A semiconductor package substrate (10) has an array of package sites (13,14,16,21,22, and 23) that are substantially identical. The entire array of package sites (13,14,16,21,22, and 23) is covered by an encapsulant (19). The individual package sites (13,14,16,21,22, and 23) are singulated by sawing through the encapsulant (19) and the underlying semiconductor package substrate (10).

12 Claims, 1 Drawing Sheet

SEMICONDUCTOR PACKAGE AND METHOD THEREOF

BACKGROUND OF THE INVENTION

The present invention relates, in general, to packaging techniques, and more particularly, to a novel semiconductor package.

In the past, the semiconductor industry has utilized a variety of encapsulation techniques for forming the body of semiconductor packages. Typically, the semiconductor and other devices are assembled onto an interconnect platform or substrate such as a leadframe, printed circuit board or ceramic substrate. One particular encapsulating technique, commonly referred to as glob-top, involves dispensing an encapsulant to cover semiconductor devices or other components that are assembled onto the substrate. One problem with this prior technique is the planarity of the top surface of the encapsulant. Often, the top surface has a convex shape. Because of the convex shape, automated pick and place equipment can not utilize the resulting semiconductor package. Also, it is difficult to mark the top surface because of the convex shape.

Such techniques usually encapsulate a single assembly site on a substrate and after encapsulation, the assembly site is singulated to form an individual package. Consequently, assembly time and singulation time are long and result in high package cost.

Accordingly, it is desirable to have a semiconductor package that has a substantially planar surface that can be utilized with automated pick and place equipment, that is easily marked, and that increases throughput thereby reducing the cycle time and assembly costs.

DETAILED DESCRIPTION OF THE DRAWINGS

Figure 1:
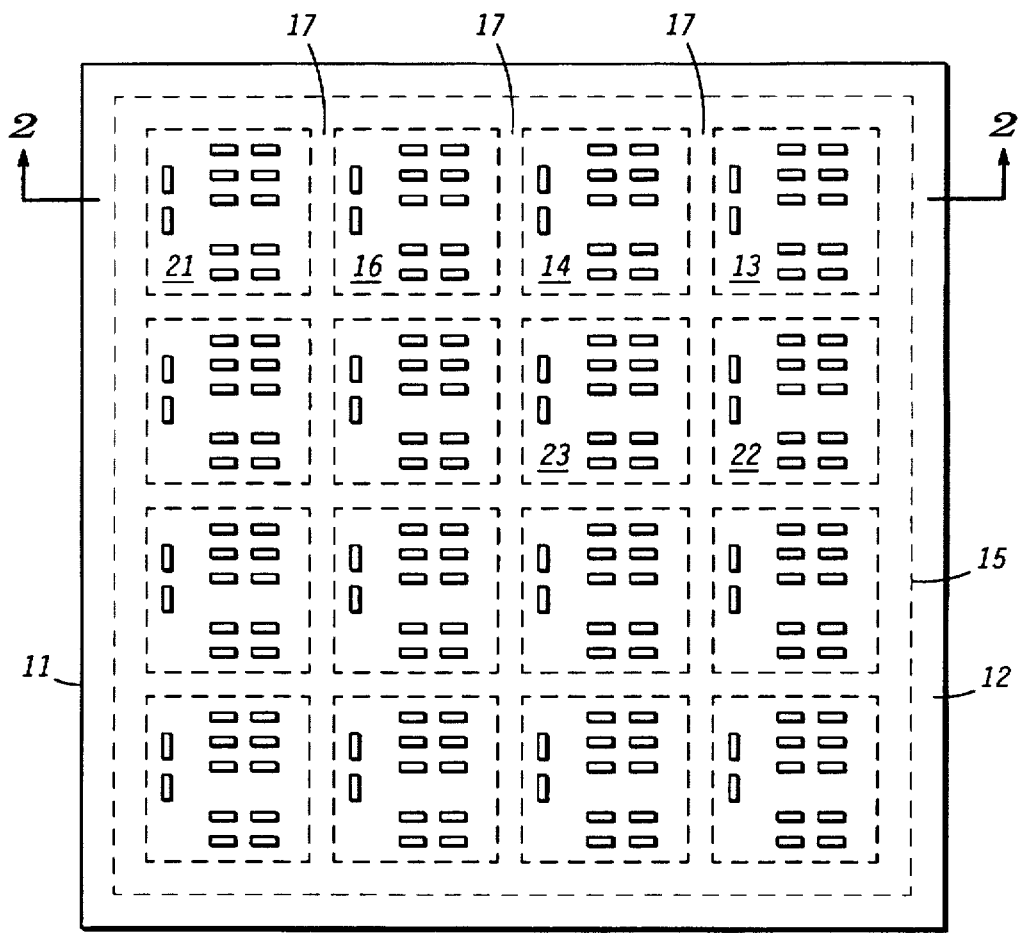
FIG. 1 illustrates a plan view of a semiconductor package at a stage of manufacturing in accordance with the present invention.

FIG. 1 schematically illustrates an embodiment of a semiconductor package substrate or semiconductor package 10 at a stage of manufacturing. Package 10 includes an interconnect substrate 11 that has a plurality of package sites such as package sites 13, 14, 16, 21, 22, and 23. As will be seen hereinafter, each of sites 13, 14, 16, 21, 22, and 23 will subsequently be singulated into an individual singulated semiconductor package. Each of sites 13, 14, 16, 21, 22, and 23 are substantially identical and have areas within each site for attaching and interconnecting a plurality of electronic components such as active semiconductor devices, and passive elements such as resistors and capacitors. Each of sites 13, 14, 16, 21, 22, and 23 are separated by a space, for example space 17 between sites 16 and 21, so that each site may be singulated into an individual package.

Substrate 11 can have a variety of forms including a stamped leadframe, a ceramic substrate, a printed circuit board substrate, and other configurations that are well known to those skilled in the art. As shown in FIG. 1, substrate 11 is a ceramic substrate having multiple layers of electrical interconnect separated by dielectrics, and multiple attachment areas.

Substrate 11 also includes a dam-bar area 12 around the periphery of substrate 11, thus, surrounding the periphery of the plurality of package sites as indicated by a dashed line 15. As will be seen hereinafter, dam-bar area 12 is used for encapsulating package 10 and individual packages formed by each package site of the plurality of package sites, such as sites 13, 14, 16, 21, 22, and 23.

Figure 2:
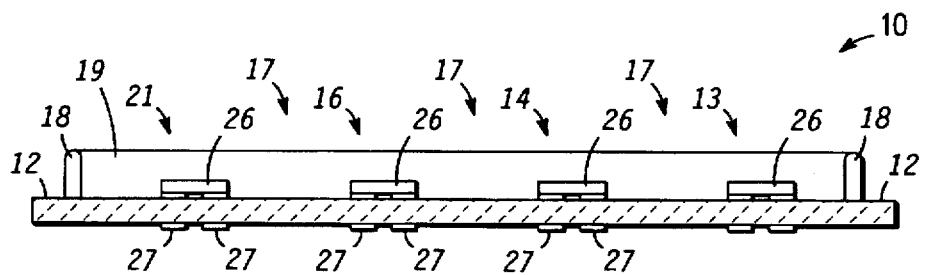
FIG. 2 illustrates a cross-sectional view of the package of FIG. 1 at a subsequent manufacturing stage.

FIG. 2 illustrates a cross-sectional schematic of package 10 at a subsequent stage of manufacturing and is taken along cross-sectional line 2—2 shown in FIG. 1. The same reference numbers are used to represent the same elements among the drawings. Typically, components such as semiconductor devices or passive elements are attached to each package site as illustrated by a component 26 attached to sites 13, 14, 16, and 21. Many components may be attached to each package site, device 26 is shown only for illustration purposes. As shown in FIG. 2, encapsulating each package site of the plurality of package sites and associated components includes forming a dam-bar 18 on area 12. Dam-bar 18 creates a cavity containing the plurality of package sites. Dam-bar 18 is formed by dispensing a first encapsulating material onto area 12. The first encapsulating material has a first viscosity that is sufficiently high so that the encapsulating material does not flow across substrate 11 but substantially remains as dispensed onto area 12. Typically, the first encapsulating material has a high viscosity that is greater than approximately 500,000 centi-poise (cps), and typically has a viscosity of 1,000,000 to 2,000,000 cps at approximately 25° C. (degrees Celsius). One suitable first encapsulating material for dam-bar 18 is a rigid thermosetting epoxy such as FP-4451 manufactured by Hysol-Dexter of Industry, Calif.

Generally, the first encapsulating material is heated during dispensing by heating the syringe or dispensing mechanism so that the first encapsulating material can be dispensed. Additionally, substrate 11 generally is also heated to a higher temperature so that the first encapsulating material flows sufficiently to form dam-bar 18. Generally, the dispensing mechanism or syringe is heated to approximately forty to fifty degrees Celsius (40°–50° C.), and substrate 11 generally is heated to approximately eighty to ninety degrees Celsius.

Thereafter, a second encapsulating material is dispensed within the cavity formed by dam-bar 18 to form an encapsulant 19 covering the components on substrate 11. The thickness of encapsulant 19 is sufficient to cover and protect components such as component 26 formed on substrate 11. The second encapsulating material has a second viscosity that is sufficiently low so that the second encapsulating material flows to fill the cavity leaving no voids and surrounds the components and attachment wires used to connect components to substrate 11. The second viscosity is less than the 500,000 cps high viscosity of the first encapsulating material and typically is approximately 20,000 to 200,000 cps at 25° C. One example of a suitable material for the second encapsulating material is FP-4650 manufactured by Hysol-Dexter. Additionally, the second encapsulating material typically has the same chemical base as the first encapsulating material so that the two materials bond at the interface to minimize separation and potential contamination. During dispensing, the second encapsulating material and substrate 11 are heated similarly to the heating used for dispensing the first encapsulating material.

After dispensing, the first and second encapsulating material are heated to gel both encapsulating materials in order to control subsequent out gassing and warpage of substrate 11. Typically, both encapsulating materials are gelled for approximately one hour at one hundred ten degrees Celsius. Subsequently, dam-bar 18 and encapsulant 19 are cured so that encapsulant 19 forms a continuous encapsulating material covering the underlying components. Typically the curing is performed at a temperature of approximately 165° C. for a time of up to two hours. After curing, each individual package site is singulated into a singulated package by using space 17 for sawing completely through encapsulant 19 and substrate 11. For example, a ceramic saw is used to saw through encapsulant 19 and substrate 11 when substrate 11 is ceramic material. Other singulation techniques could be utilized including laser cutting through encapsulant 19 and substrate 11.

The area covered by encapsulant 19 should be larger than the meniscus formed by the second encapsulating material so that the top surface of encapsulant 19 remains substantially planar. For example, the top surface should have a deviation of less than plus or minus 0.13 millimeters across the surface of encapsulant 19. As shown in FIG. 2, the plurality of package sites are formed in an 4×4 array but could also be formed in other arrays. An array that is sixty by sixty millimeters provides a sufficient area to provide the desired planarity.

It should be noted that other encapsulating techniques could be utilized to cover the plurality of package sites with an encapsulating material in order to encapsulate package 10. For example, dam-bar 18 could be a premanufactured frame applied to area 12, and overmolding or other techniques could be used for the encapsulating. Thereafter each package site can be singulated as described hereinbefore.

Figure 3:
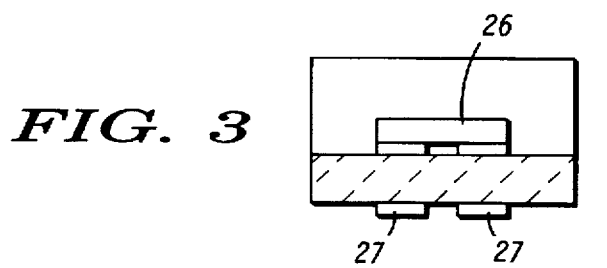
FIG. 3 illustrates a cross-sectional view of a singulated semiconductor package in accordance with the present invention.

FIG. 3 illustrates a cross-sectional view of a singulated package formed from a package site such as package site 13 shown in FIG. 1 and FIG. 2.

By now it should be appreciated that there has been provided a novel semiconductor package and method therefor. Forming a plurality of package sites on a substrate and using one dam-bar around the entire periphery surrounding the plurality of package sites, facilitates forming a substantially planar surface on the encapsulant. Forming a substantially planar surface allows each singulated package to have a substantially planar surface and facilitates utilization with automated pick and place equipment, and also facilitates clear marking of each singulated package. Forming the plurality of package sites adjacent to each other and covering the plurality of package sites with one continuous encapsulant minimizes space required to singulate the package sites and maximizes the number of package sites on a substrate thereby providing the smallest package outline and lowering package costs.

We claim:

1. A method of forming a semiconductor package comprising:

forming a substrate having a plurality of package sites and an electronic component attached to the plurality of package sites;

encapsulating the plurality of package sites wherein the encapsulating forms a continuous encapsulating material covering the plurality of package sites; and singulating through the encapsulating material to singulate each package site into an individual package.

2. A method of forming a semiconductor package comprising:

encapsulating a plurality of package sites that are on a substrate wherein the encapsulating forms a continuous encapsulating material covering the plurality of package sites and wherein encapsulating the plurality of package sites includes forming the encapsulating material to have a top surface planarity deviation of less than 0.13 millimeters; and singulate through the encapsulating material to singulate each package site.

3. A method of forming a semiconductor package comprising:

encapsulating a plurality of package sites that are on a substrate wherein the encapsulating forms a continuous encapsulating material covering the plurality of package sites and wherein encapsulating the plurality of package sites includes forming a dam bar surrounding the periphery of the plurality of package sites for forming a cavity containing the plurality of package sites, and dispensing the encapsulating material within the cavity; and singulating through the encapsulating material to singulate each package site.

4. The method of claim 3 wherein forming the dam bar includes dispensing a first encapsulating material having a first viscosity.

5. The method of claim 4 wherein dispensing the encapsulating material within the cavity includes dispensing a second encapsulating material having a second viscosity that is lower than the first viscosity.

6. The method of claim 5 wherein dispensing the first encapsulating material having the first viscosity includes having a viscosity of 1,000,000 to 2,000,000 cps.

7. The method of claim 5 wherein dispensing the second encapsulating material having the second viscosity includes having a viscosity less than 500,000 cps.

8. The method of claim 5 further including gelling both the first and second encapsulating materials prior to curing both the first and second encapsulating materials.

9. The method of claim 5 wherein dispensing the first encapsulating material includes heating the first encapsulating material.

10. The method of claim 5 wherein dispensing the second encapsulating material includes heating the second encapsulating material.

11. The method of claim 1 wherein singulating through the encapsulating material includes sawing through the encapsulating material and the substrate.

12. The method of claim 1 wherein encapsulating the plurality of package sites includes encapsulating by overmolding.

* * * * *

UNITED STATES PATENT AND TRADEMARK OFFICE
CERTIFICATE OF CORRECTION

PATENT NO. : 5,776,798
DATED : July 7, 1998
INVENTOR(S) : Son Quan et al.

It is certified that error appears in the above-identified patent and that said Letters Patent is hereby corrected as shown below:

In column 4, claim 2, line 13, delete "singulate" and insert --singulating--.

Signed and Sealed this

Fifteenth Day of June, 1999

Attest:

Q. TODD DICKINSON

*Attesting Officer*   Acting Commissioner of Patents and Trademarks